US010425764B2

(12) United States Patent
Dressler et al.

(10) Patent No.: US 10,425,764 B2
(45) Date of Patent: Sep. 24, 2019

(54) BASS MANAGEMENT FOR OBJECT-BASED AUDIO

(71) Applicant: DTS, Inc., Calabasas, CA (US)

(72) Inventors: Roger Dressler, McMinnville, OR (US); Pierre-Anthony Lemieux, San Mateo, CA (US)

(73) Assignee: DTS, Inc., Calabasas, CA (US)

( * ) Notice: Subject to any disclaimer, the term of this patent is extended or adjusted under 35 U.S.C. 154(b) by 0 days.

(21) Appl. No.: 15/236,416

(22) Filed: Aug. 13, 2016

(65) Prior Publication Data

US 2017/0048640 A1 Feb. 16, 2017

Related U.S. Application Data

(60) Provisional application No. 62/205,660, filed on Aug. 14, 2015.

(51) Int. Cl.
*H03G 5/00* (2006.01)
*H04S 7/00* (2006.01)

(52) U.S. Cl.
CPC .......... *H04S 7/307* (2013.01); *H04S 2400/07* (2013.01); *H04S 2400/11* (2013.01); *H04S 2400/13* (2013.01)

(58) Field of Classification Search
CPC .. H04S 7/307; H04S 2400/07; H04S 2400/11; H04S 2400/13; G10L 19/20
See application file for complete search history.

(56) References Cited

U.S. PATENT DOCUMENTS 6,332,026 B1 12/2001 Kuusama et al.
6,529,787 B2 3/2003 Weikil et al.
(Continued)

FOREIGN PATENT DOCUMENTS

WO 2013006338 A3 1/2013
WO 2014175669 A1 10/2014
WO 2014204911 A1 12/2014

OTHER PUBLICATIONS

Florian Volk, Martin Straubinger, Hugo Fasti, "Psychoacoustical experiments on loudness perception in wave field synthesis," Proceedings of 20th International Congress on Acoustics, ICA 2010, Aug. 23-27, 2010, Sydney, Australia, AG Technische Akustik, Lehrstuhl fur Mensch-Maschine-Kommunikation, Technische Universitat, Munchen, Germany.

(Continued)

*Primary Examiner* — Andrew L Sniezek
(74) *Attorney, Agent, or Firm* — Craig S. Fischer

(57) ABSTRACT

A bass management system and method for mitigating bass management errors by using explicit information available in the object audio rendering process and deriving the correct subwoofer contribution for each audio object. Embodiments of the bass management system and method are used to maintain the correct balance of the bass reproduced by the subwoofer relative to the sound coming out of the other speakers. The system and method are useful for a variety of different speaker configurations, including speaker configurations having different speaker sub-zones. Power-normalized gain coefficients for each speaker are combined and the power of the combined gain coefficients is computed and used to obtain a power-preserving subwoofer contribution coefficient. This subwoofer contribution coefficient is applied to the bass portion of the audio signal and audio objects to determine the contribution of a particular subwoofer.

15 Claims, 7 Drawing Sheets

(56) References Cited

U.S. PATENT DOCUMENTS

| | | | |
|---|---|---|---|
| 6,914,987 | B2 | 7/2005 | Blind et al. |
| 7,164,768 | B2 | 1/2007 | Aylward et al. |
| 7,912,566 | B2 | 3/2011 | Lee et al. |
| 7,974,417 | B2 | 7/2011 | Kim et al. |
| 8,175,292 | B2 | 5/2012 | Aylward et al. |
| 8,238,576 | B2 | 8/2012 | Cooper et al. |
| 8,335,324 | B2 | 12/2012 | Zhang et al. |
| 8,396,576 | B2 | 3/2013 | Kraemer et al. |
| 8,675,892 | B2 | 3/2014 | Hogue et al. |
| 8,699,731 | B2 | 4/2014 | Beckinger et al. |
| 8,744,247 | B2 | 6/2014 | Crockett et al. |
| 8,751,832 | B2 | 6/2014 | Cashin et al. |
| 8,934,647 | B2 | 1/2015 | Joyce et al. |
| 8,934,655 | B2 | 1/2015 | Breen et al. |
| 2007/0003075 | A1 | 1/2007 | Cooper et al. |
| 2008/0075302 | A1 | 3/2008 | Wei |
| 2009/0257601 | A1 | 10/2009 | Motsenbocker |
| 2009/0268917 | A1* | 10/2009 | Croft, III .................. H04S 3/00 381/17 |
| 2010/0158275 | A1 | 6/2010 | Zhang et al. |
| 2010/0278346 | A1 | 11/2010 | Hogue et al. |
| 2011/0002467 | A1 | 1/2011 | Nielsen |
| 2011/0044486 | A1 | 2/2011 | Borkowski |
| 2011/0164855 | A1 | 7/2011 | Crockett et al. |
| 2011/0170715 | A1 | 7/2011 | Kim et al. |
| 2012/0263324 | A1 | 10/2012 | Joyce et al. |
| 2012/0263335 | A1 | 10/2012 | Breen et al. |
| 2012/0308042 | A1 | 12/2012 | Victor |
| 2013/0163784 | A1 | 6/2013 | Tracey et al. |
| 2014/0119570 | A1 | 5/2014 | Davis et al. |
| 2014/0133683 | A1 | 5/2014 | Robinson et al. |
| 2014/0139738 | A1 | 5/2014 | Mehta et al. |
| 2014/0153726 | A1 | 6/2014 | Terwel |
| 2014/0341388 | A1 | 11/2014 | Goldstein et al. |
| 2016/0150347 | A1* | 5/2016 | Fischer .................... H04R 3/12 381/303 |
| 2017/0223477 | A1* | 8/2017 | Chon ...................... H04S 1/005 |

OTHER PUBLICATIONS

Pulkki, V. "Virtual Sound Source Positioning Using Vector Base Amplitude Panning"; Journal of the Audio Engineering Society, Audio Engineering Society, New York, NY, US, vol. 45, No. 6, Jun. 1, 1997 (Jun. 1, 1997), pp. 156-466, XP002719359.

Corresponding PCT Application No. PCT/US2016/046942, Extended European Search Report, dated Mar. 7, 2019, 9 pages.

Corresponding PCT Application No. PCT/US2016/046942, International Search Report and Written Opinion; dated Oct. 27, 2016, 10 pages.

Corresponding PCT Application No. PCT/US2016/046942, International Preliminary Report on Patentability, dated Mar. 1, 2018, 9 pages.

* cited by examiner

600

BASS MANAGEMENT FOR OBJECT-BASED AUDIO

BACKGROUND

Many audio reproduction systems are capable of recording, transmitting, and playing back synchronous multi-channel audio, sometimes referred to as "surround sound." Though entertainment audio began with simplistic monophonic systems, it soon developed two-channel (stereo) and higher channel-count formats (surround sound) in an effort to capture a convincing spatial image and sense of listener immersion. Surround sound is a technique for enhancing reproduction of an audio signal by using more than two audio channels. Content is delivered over multiple discrete audio channels and reproduced using an array of loudspeakers (or speakers). The additional audio channels, or "surround channels," provide a listener with an immersive listening experience.

Surround sound systems typically have speakers positioned around the listener to give the listener a sense of sound localization and envelopment. Many surround sound systems having only a few channels (such as a 5.1 format) have speakers positioned in specific locations in a 360-degree arc about the listener. These speakers also are arranged such that all of the speakers are in the same plane as each other and the listener's ears. Many higher-channel count surround sound systems (such as 7.1, 11.1, and so forth) also include height or elevation speakers that are positioned above the plane of the listener's ears to give the audio content a sense of height. Often these surround sound configurations include a discrete low-frequency effects (LFE) channel that provides additional low-frequency bass audio to supplement the bass audio in the other main audio channels. Because this LFE channel requires only a portion of the bandwidth of the other audio channels, it is designated as the ".X" channel, where X is any positive integer including zero (such as in 5.1 or 7.1 surround sound).

In traditional channel-based multichannel sound systems, a bass management technique collects the bass from the main audio channels to drive the one or more subwoofers. Because with bass management the main speakers only have to reproduce the higher-frequency portion of the audio signal and not the bass signal, the main speakers can be smaller. Moreover, in traditional channel-based multichannel sound systems the audio signal is output to a specific speaker or speakers in a playback environment.

Audio object-based sound systems use informational data (including positional data in 3D space) associated with each audio object to position the object in the playback environment. Audio object-based systems are indifferent to the number of speakers in the playback environment. And the multitude of possible speaker configurations in playback environments increases the likelihood for bass overload when using traditional bass management systems. In particular, the bass signal is summed by amplitude and as multiple coherent bass signals are added together there is the possibility for playing back bass signals at an undesirably high amplitude. This phenomenon is sometimes called "bass build-up." In other words, the electrical summation of coherent bass signals tends to overemphasize the result compared to how those signals would sound if each were reproduced acoustically by a full-range speaker. This bass build-up problem is exacerbated when audio object-based audio is used.

"Bass management" (also known as "bass redirection") is a phrase used to describe the process of collecting the low-frequency signals from a number of audio channels (or speakers) and redirecting it to a subwoofer. Classic bass management techniques use low-pass filters to isolate the low-frequency portion (or bass signal) of audio channel. The bass signal of each audio channel then is summed along with the low-frequency effects signal to form the subwoofer signal that is reproduced using the subwoofer. Speakers typically differ in their ability to reproduce bass. Speakers with smaller woofers (approximately 6" and less) are less capable of producing very low or deep bass as compared with larger speakers or speakers specifically designed for bass reproduction (such as subwoofers).

Going from mono to stereo to more and more speakers within a sound system, in the end there are all these additional channels, but we still want to distill them down to one signal that we feed the subwoofer. This is because the subwoofer reproduces very low-frequencies and humans don't respond well in terms of directionality to very low frequencies. The perception will be that the subwoofer handles the bass of sounds placed anywhere in the playback environment.

When using audio object-based sound systems the bass build-up problem is exacerbated due mainly to two issues. First, the playback environment may be grouped into playback zones and the bass signal at some zones may not be desirable all the time. Many cinemas have subwoofers in the back walls to represent the bass from the surrounds in the rear speakers and subwoofers from behind the screen for handling the bass from those speakers. For example, the playback environment may be a cinema with the speakers grouped into two playback zones the front of the room (behind the screen) and the rear of the room. Each of the playback zones has a subwoofer. In some cases it may be desirable to reproduce a bass signal on the subwoofer in the rear playback zone but not the front playback zone. The bass frequencies tend to blend better with higher-frequency audio if the bass signal is close to the other sound coming out of the regular speakers that it is associated with.

Another issue is that object audio is unique in that there is size control over the sound. This allows us to spread the sound from one or two speakers to as many as all the speakers. No matter the size is adjusted it is desirable to spread its coverage but not to change the ratio of the bass sound to the main sound.

One simplistic way to overcome these problems is to apply a fixed scaling factor (or gain coefficient) to each of the bass signals. However, this is only correct for the assumed signals, because it is a first order approximation. It is not a precise way of controlling bass buildup.

A more sophisticated bass management technique extracts the bass signal prior to the spatial rendering of any audio objects. The shortcomings of this technique is that it does not support bass management within subset zones of speakers. This means that if there are speakers that should not be included in the bass management the collected bass signal is mixed back into that speaker such that the speaker's bass signal is still being distributed to the subwoofer. Moreover, that speaker is not only reproducing the bass originally destined for it, but bass from all the other bass-managed speakers as well.

Another type of bass management technique uses wave-field synthesis (WFS). This technique scales the gain of each audio object in order to achieve the correct level of bass from a subwoofer. However, it is not possible, in an error-free manner, to transfer a mix of a subwoofer channel between WFS systems having different loudspeaker densities and a different number of loudspeakers. Moreover, there is no intent and no means to directly address bass buildup resulting from the number of loudspeakers involved.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Embodiments of the bass management system and method are used to maintain the correct balance of the bass reproduced by the subwoofer relative to the sound coming out of the other speakers. The system and method are useful for a variety of different speaker configurations, including speaker configurations having different speaker sub-zones.

In embodiments of the system and method only the bass relevant to a certain zone of speakers is collected for that zone's subwoofer. Any speakers that are excluded from bass management (e.g., L, C, R screen speakers), will receive only the bass appropriate for them (their respective channels plus bass from objects positioned within a certain proximity). The main benefits of embodiments of the system and method are improved sound localization, more uniform spectral balance across the audience, more seamless time blending of the subs with main speakers, and increased headroom.

Embodiments of the system and method assume that all sounds emanate from a consistent distance. No wave field property metadata is used, as it does not exist. Moreover, embodiments of the system and method are power preserving and work for any renderer that generates power-normalized speaker gains across one or more speakers.

Embodiments of the bass management method process an audio signal by inputting or receiving from a renderer a number of power-normalized speaker gain coefficients. The audio signal contains an audio object and associated rendering information. The number of gain coefficients is such that there is a gain coefficient for each speaker channel and each audio object. The method combines the gain coefficients and computes the power of the combined gain coefficients to obtain a power-preserving subwoofer contribution coefficient. Power preserving means that the power of the combined gain coefficients is preserved.

Embodiments of the method also apply the subwoofer contribution coefficient to a subwoofer audio signal to obtain a gain-modified subwoofer audio signal. The subwoofer audio signal is the signal containing the low-frequency or bass portion of the audio signal and audio objects. In some embodiments this bass portion is obtained by using a low-pass filter to strip the low frequencies from the audio signal and audio objects. The gain-modified subwoofer audio signal is played back through a subwoofer to ensure that an amount of bass signal is applied to the subwoofer avoids bass management error. Moreover, embodiments of the method ensures that when the audio objects are spatially rendered in the audio environment that amount of subwoofer contribution is correct for each of the multiple audio objects and that any bass management errors are avoided or mitigated.

In some embodiments the speakers in the audio environment are divided into multiple speaker zones. In some embodiments these speaker zones contain a different number of speakers, different types of speakers, or both. This is as compared to other speaker zones in the audio environment. In the case of multiple speaker zone embodiments a subwoofer contribution coefficient is computed for each of the speaker zones. In some embodiments the subwoofer contribution coefficient is computed for each subwoofer in the multiple speaker zones.

The power of the combined gain coefficients is obtained by first squaring each of the gain coefficients and obtaining squared gain coefficients. These squared gain coefficients are summed or added together to obtain a squared sum. The square root of the square sum is taken and the result is the subwoofer contribution coefficient. If there are multiple speaker zones then only the gain coefficients from the speakers contained in the particular speaker zone (including the subwoofer) are used in the calculation of the subwoofer contribution coefficient.

It should be noted that alternative embodiments are possible, and steps and elements discussed herein may be changed, added, or eliminated, depending on the particular embodiment. These alternative embodiments include alternative steps and alternative elements that may be used, and structural changes that may be made, without departing from the scope of the invention.

DRAWINGS DESCRIPTION

Referring now to the drawings in which like reference numbers represent corresponding parts throughout:

DETAILED DESCRIPTION

In the following description of embodiments of a bass management system and method reference is made to the accompanying drawings. These drawings shown by way of illustration specific examples of how embodiments of the bass management system and method may be practiced. It is understood that other embodiments may be utilized and structural changes may be made without departing from the scope of the claimed subject matter.

I. Terminology

Following are some basic terms and concepts used in this document. Note that some of these terms and concepts may have slightly different meanings than they do when used with other audio technologies.

This document discusses both channel-based audio and object-based audio. Music or soundtracks traditionally are created by mixing a number of different sounds together in a recording studio, deciding where those sounds should be heard, and creating output channels to be played on each individual speaker in a speaker system. In this channel-based audio, the channels are meant for a defined, standard speaker configuration. If a different speaker configuration is used, the sounds may not end up where they are intended to go or at the correct playback level.

In object-based audio, all of the different sounds are combined with information or metadata describing how the sound should be reproduced, including its position in a three-dimensional (3D) space. It is then up to the playback system to render the object for the given speaker system so that the object is reproduced as intended and placed at the correct position. With object-based audio, the music or soundtrack should sound essentially the same on systems with different numbers of speakers or with speakers in different positions relative to the listener. This methodology helps preserve the true intent of the artist.

Figure 1:
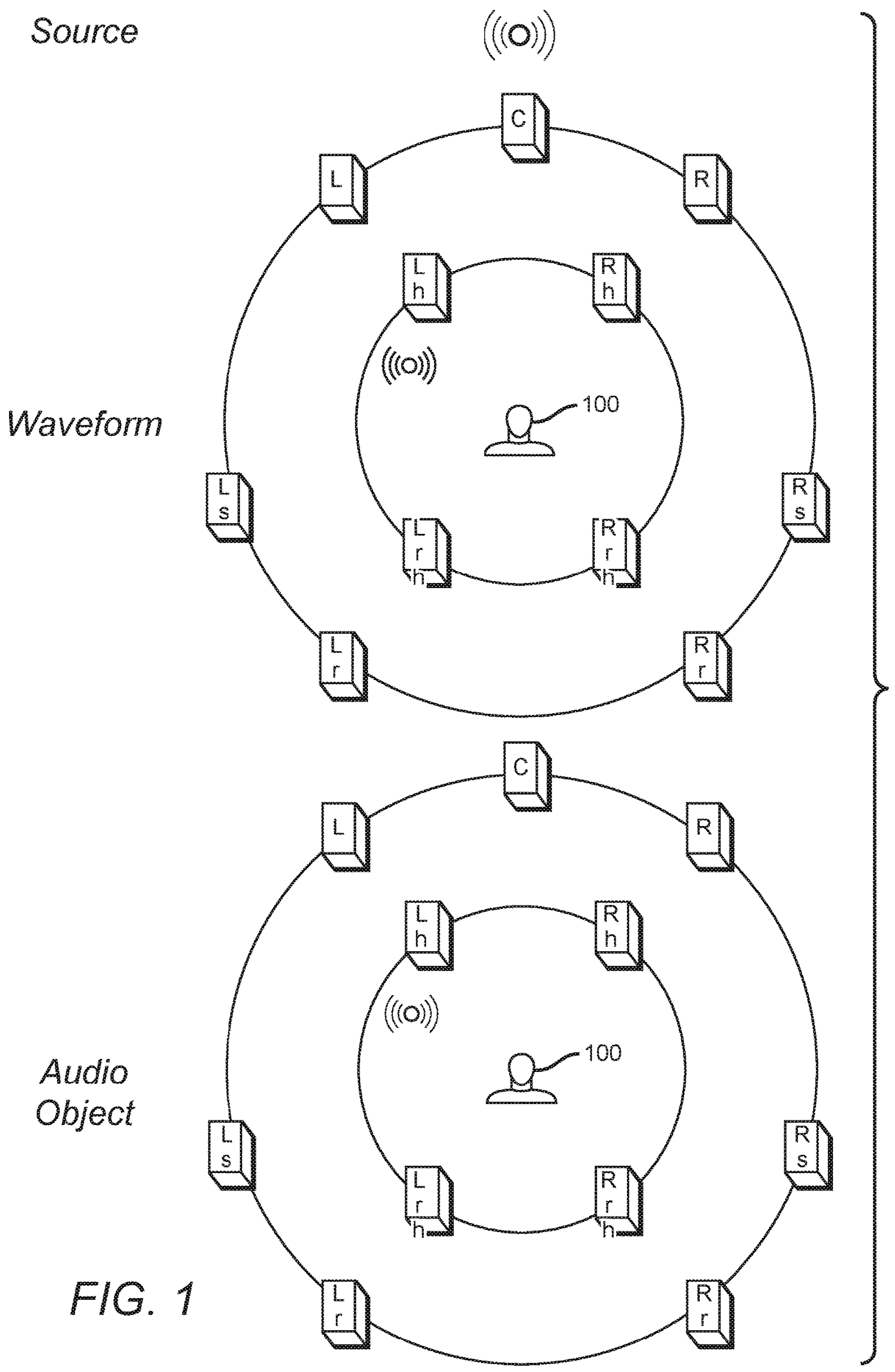
FIG. 1 is a diagram illustrating the difference between the terms "source," "waveform," and "audio object."

FIG. 1 is a diagram illustrating the difference between the terms "source," "waveform," and "audio object." As shown in FIG. 1, the term "source" is used to mean a single sound wave that represents either one channel of a bed mix or the sound of one audio object. When a source is assigned a specific position in a 3D space around a listener 100, the combination of that sound and its position in 3D space is called a "waveform." An "audio object" (or "object") is created when a waveform is combined with other metadata (such as channel sets, audio presentation hierarchies, and so forth) and stored in the data structures of an "enhanced bitstream." The "enhanced bitstream" contains not only audio data but also spatial data and other types of metadata. An "audio presentation" is the audio that ultimately comes out of embodiments of the bass management system and method.

The phrase "gain coefficient" is an amount by which the level of an audio signal is adjusted to increase or decrease its volume. The term "rendering" indicates a process to transform a given audio distribution format to the particular playback speaker configuration being used. Rendering attempts to recreate the playback spatial acoustical space as closely to the original spatial acoustical space as possible given the parameters and limitations of the playback system and environment.

When either surround or elevated speakers are missing from the speaker layout in the playback environment, then audio objects that were meant for these missing speakers may be remapped to other speakers that are physically present in the playback environment. In order to enable this functionality, "virtual speakers" can be defined that are used in the playback environment but are not directly associated with an output channel. Instead, their signal is rerouted to physical speaker channels by using a downmix map.

Figure 2:
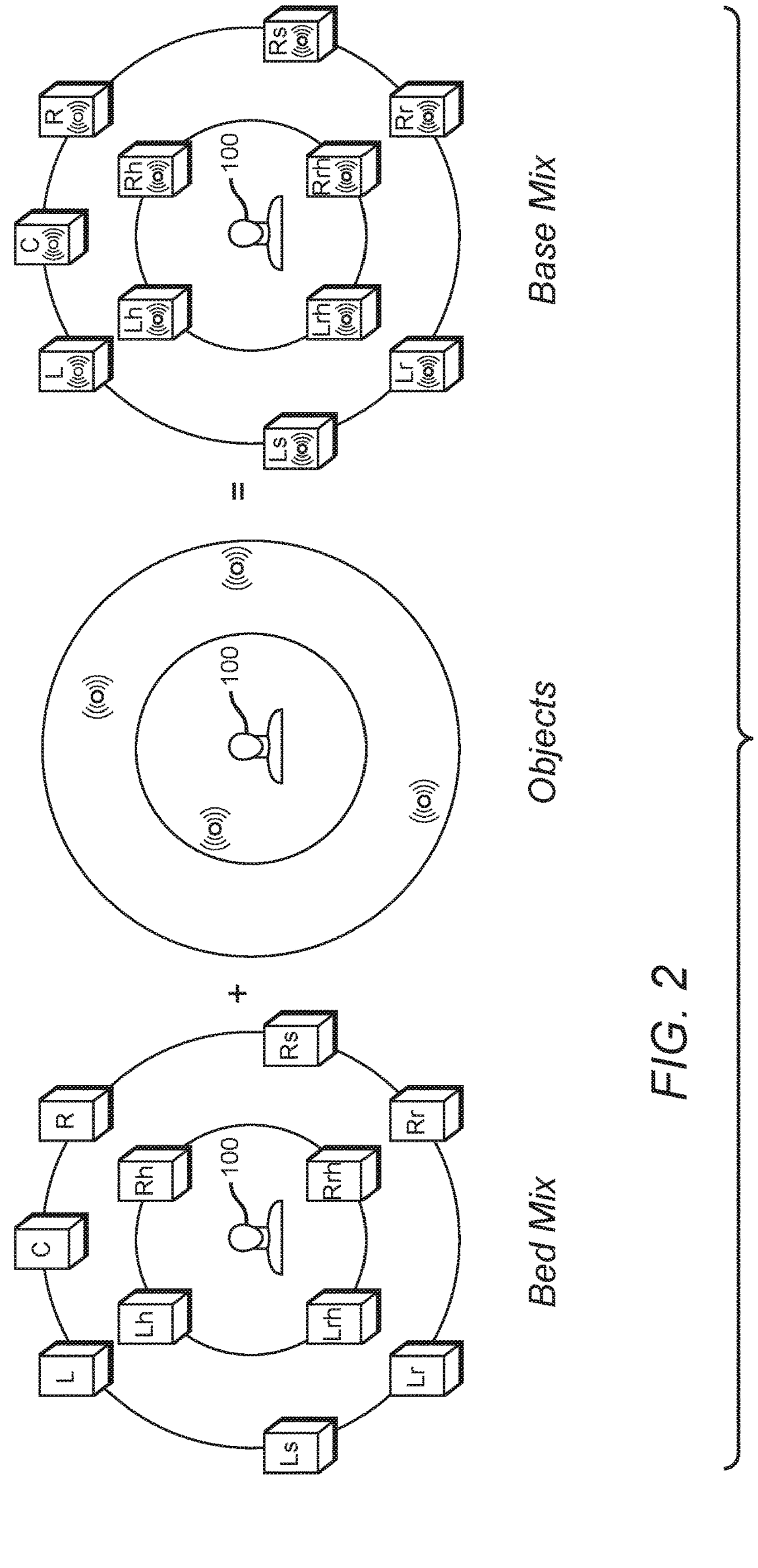
FIG. 2 is an illustration of the difference between the terms "bed mix," "objects," and "base mix."

FIG. 2 is an illustration of the difference between the terms "bed mix," "objects," and "base mix." Both "bed mix" and "base mix" refer to channel-based audio mixes (such as 5.1, 7.1, 11.1, and so forth) rendered to the listener 100 that may be contained in an enhanced bitstream either as channels or as channel-based objects. The difference between the two terms is that a bed mix does not contain any of the audio objects contained in the bitstream. A base mix contains the complete audio presentation presented in channel-based form for a standard speaker layout (such as 5.1, 7.1, and so forth). In the base mix, any objects that are present are mixed into the channel mix. This is illustrated in FIG. 2, which shows that the base mix include both the bed mix and any audio objects.

Subwoofers are a common way to extend the bass response in home audio systems. Subwoofers in the home allow the main speakers to be smaller, less expensive, and more easily replaced. This is especially useful in surround sound systems that include 5, 7, or more speakers. In these systems, "bass management" techniques apply crossover filters (complementary low-pass and high-pass filters) to redirect the bass frequencies from the main channels, add them together, and present the combined signal to the subwoofer.

Figure 3:
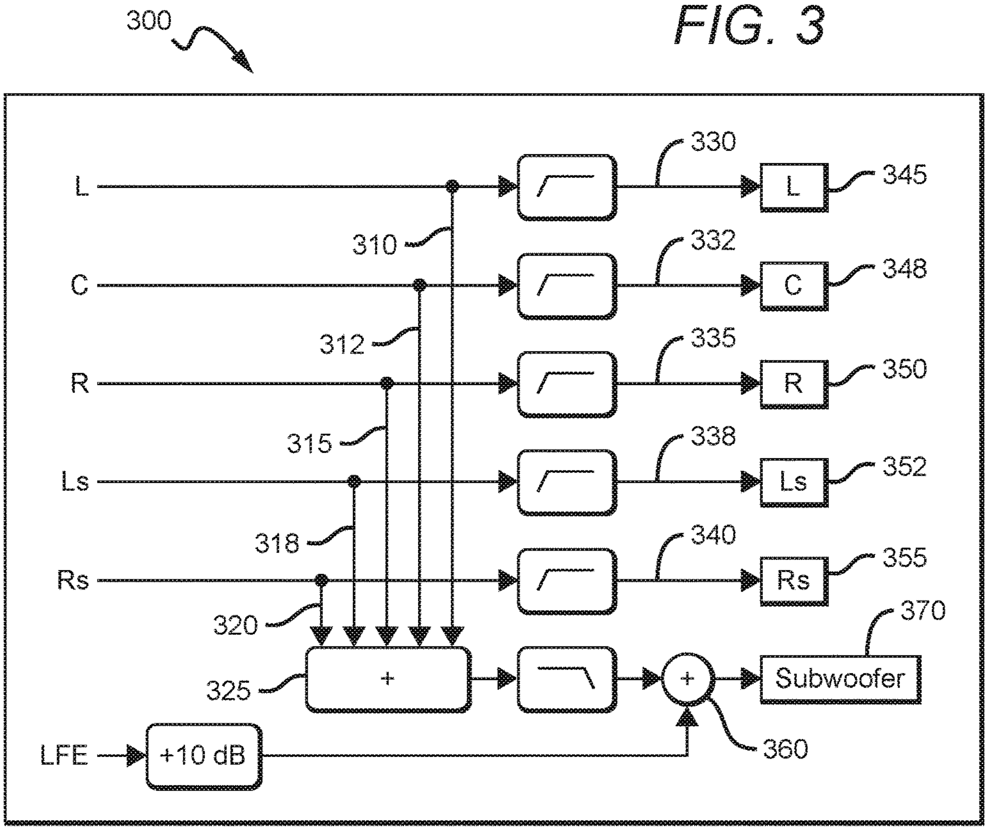
FIG. 3 is a block diagram illustrating standard bass management for a 5.1 audio system.

FIG. 3 is a block diagram illustrating this type of bass management technique 300 applied to a 5.1 channel-based audio system. In particular, the main channels Left (L), Center (C), Right (R), Left-Surround (Ls), and Right-Surround (Rs) have their respective bass signals 310, 312, 315, 318, 320 redirected and summed 325. The filtered main channels 330, 332, 335, 338, 340 are rendered through the respective speakers 345, 348, 350, 352, 355. The Low-Frequency Effects (LFE) channel is combined 360 with the summed bass signals and rendered through a subwoofer 370.

Historically, cinemas have used subwoofers for many decades, driven from a specific LFE channel in the soundtrack. However, bass management typically was not used. Current 5.1 cinemas have multiple surround speakers distributing the surround channels around the audience. There may be 5, 10 or more speakers in a surround array all carrying the same signal and thus sharing the load.

With the advent of object-based audio for film sound, such as multi-dimensional audio (MDA), each speaker is driven individually. Thus, each speaker may carry unique signals or play in isolation. There is now a desire to improve the sound quality of the surround speakers to better match the screen channels. This means as sounds are panned around the cinema the perceived quality remains more consistent. Bass management is seen as an effective means to improve the bass capability and power handling of the surround speakers. This requires every surround speaker's signal to be included in the bass management system and method.

Figure 4:
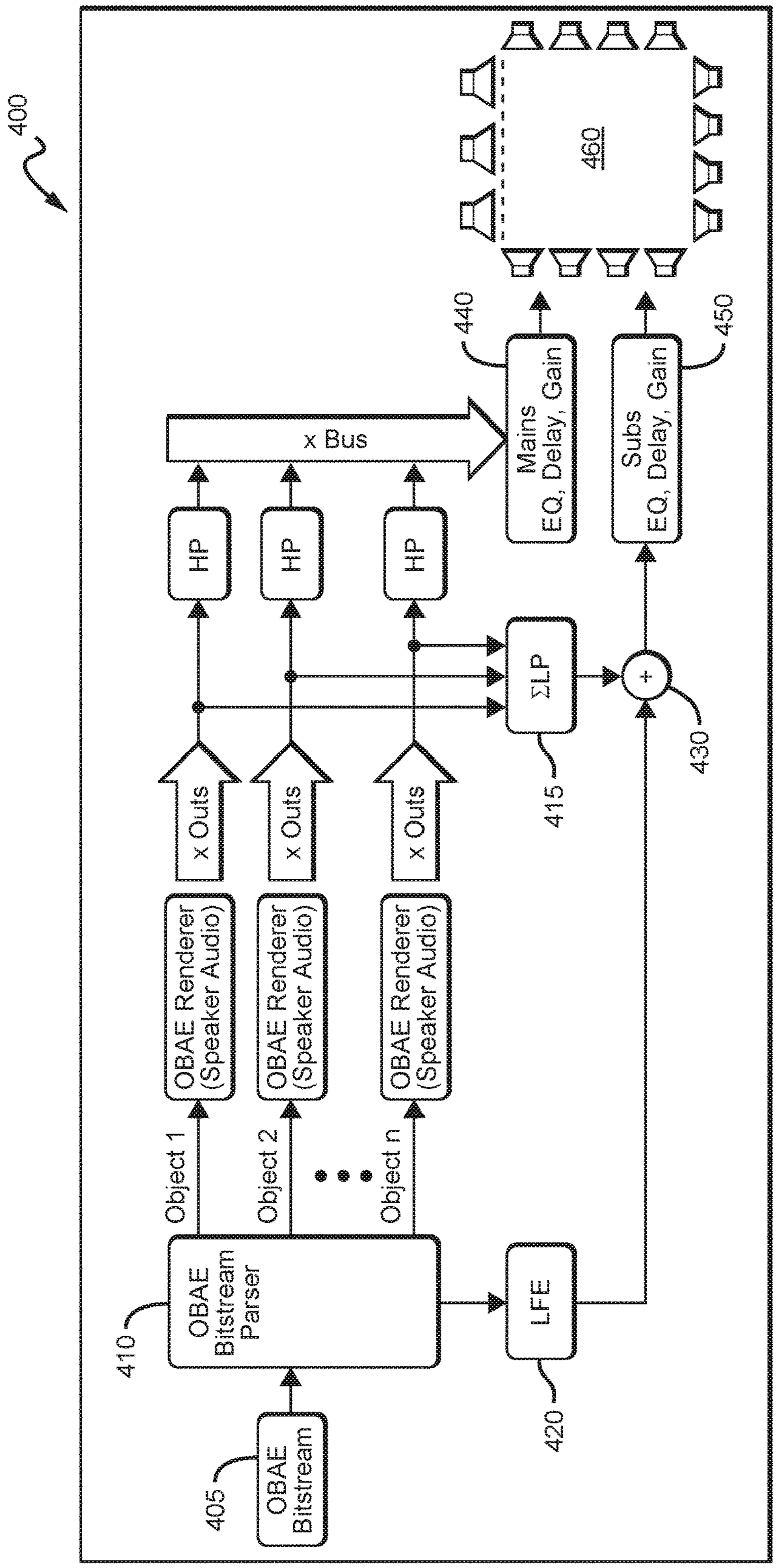
FIG. 4 is a block diagram illustrating a standard bass management concept shown in FIG. 3 applied to an audio object-based system.

FIG. 4 is a block diagram illustrating the standard bass management technique shown in FIG. 3 applied to an audio object-based system 400. In FIG. 4, the term "OBAE" refers to Object-Based Audio Essence. As shown in FIG. 4, an OBAE bitstream 405 is input to an OBAE bitstream parser 410 that parses out n number of objects, namely Object 1 to Object n. Each of the Objects has the low-frequency removed and redirected and summed 415. The LFE 420 of the OBAE bitstream 405 is also summed 430 with the redirected low-frequency signals of the Objects. Main processing 440 is applied to the Objects and subs processing 450 is applied to the low-frequency signal. Both the processed main object signal and the processed subs are played back in an audio environment 460.

However, one problem with the arrangement shown in FIG. 4 is that several speakers may be fed the same signal. This will happen as a result of Vector Base Amplitude Panning (VBAP) panning, or may happen when channel-based audio is presented across an entire array, or when object spreading functions are used to extend the dimension of the sound. Instead of summing one signal for a surround array, the bass management will be summing 5, 10, or more copies of the same signal. The spreading functions, Divergence and Aperture, can involve even more speakers.

When two identical signals are electrically summed the result is 6 dB stronger. In contrast, when those two signals are played in separate speakers in a cinema, the acoustic summation will be only 3 dB stronger. That means the subwoofer level with traditional bass management summing will be 3 dB too high. If there were four source signals the error would increase to 6 dB. A modern immersive cinema may have some 30-50 speakers in total, with almost half of them feeding a bass management system. The excessive bass buildup will be significant. Because the positioning and allocation of the audio signals among the speakers changes dynamically, there is no fixed gain offset that can correctly compensate for the error buildup problem. Moreover, with an object-based system the final rendering configuration is unknown. Therefore, when applying bass management to an object-based system, the bass management system must be more intelligent as compared to standard bass management systems.

II. System and Operational Details

Embodiments of the bass management system and method mitigate bass management error by using explicit information available in the object audio rendering process to derive the correct subwoofer contribution for each audio object. Embodiments of the system and method are suitable for use in commercial cinema processors, or in non-real time pre-rendering process that may run in in a cinema media block (server). In addition, this process may prove useful in object-based consumer surround processors.

Figure 5:
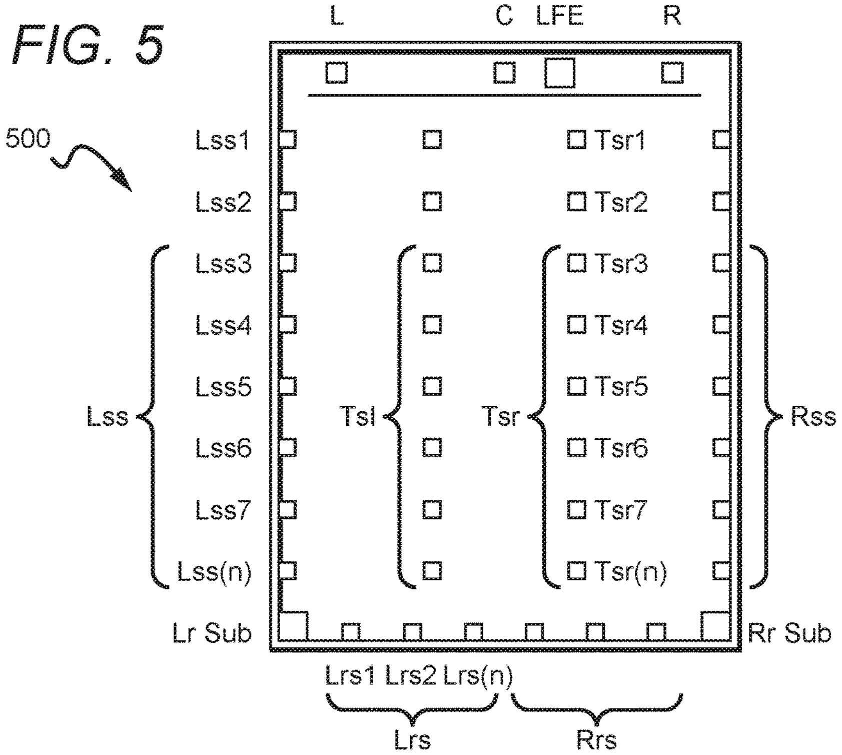
FIG. 5 illustrates a typical example of a cinema equipped for object-based audio presentation and bass management using embodiments of the system and method discussed herein.

FIG. 5 illustrates a typical example of a cinema equipped for object-based audio presentation and bass management using embodiments of the bass management system and method discussed herein. As shown in the plan view shown in FIG. 5, the typical cinema environment 500 equipped for object-based audio presentation and bass management contains several loudspeakers (or "speakers"). It should be noted that FIG. 5 illustrates exemplary embodiments of the bass management system and method and a multitude of speaker layouts, speaker types, and other variations are possible.

The speaker configuration shown in FIG. 5 includes a Left speaker (L), a Center speaker (C), and a Right speaker (R) at the front of the cinema acting as the main speakers. A Low-Frequency Effects speaker (LFE) is a subwoofer that is also placed near the front of the cinema. A Left-Side Surround (Lss) array of speakers includes n number of speakers Lss1 to Lss(n). Also on the left side is a Left-Rear Surround (Lrs) array of speakers including n number of speakers Lrs1 to Lrs(n). On the right side of the cinemas, a Right-Side Surround (Rss) array of speakers includes n number of speakers Rss1 to Rss(n). Also on the right side is a Right-Rear Surround (Rrs) array of speakers including n number of speakers Rrs1 to Rrs(n). Note that for clarity and to avoid clutter in the drawing the individual speakers in the Rss and Rrs arrays are not shown in FIG. 5.

The cinema environment 500 also includes a Top-Surround Right (Tsr) array of n number of speakers including speakers Tsr1 to Tsr(n). Similarly, on the left side of the cinema is a Top-Surround Left (Tsl) array of n number of speakers including speakers Tsl1 to Tsl(n). Once again for clarity and to avoid clutter in the drawing the individual speakers in the Tsl array are not shown in FIG. 5. The speaker configuration in the cinema environment 500 also includes a Left-Rear Sub (Lr sub) speaker. The Lr sub speaker is a subwoofer that collects bass from all Lss, Tsl, and Lrs arrays and plays that bass through the Lr sub subwoofer. Similarly, the right side of the cinema includes a Right-Rear sub (Rr sub) speaker that is a subwoofer that collects bass from all Rss, Tsr, and Rrs arrays and play that bass through the Rr sub subwoofer.

Figure 6:
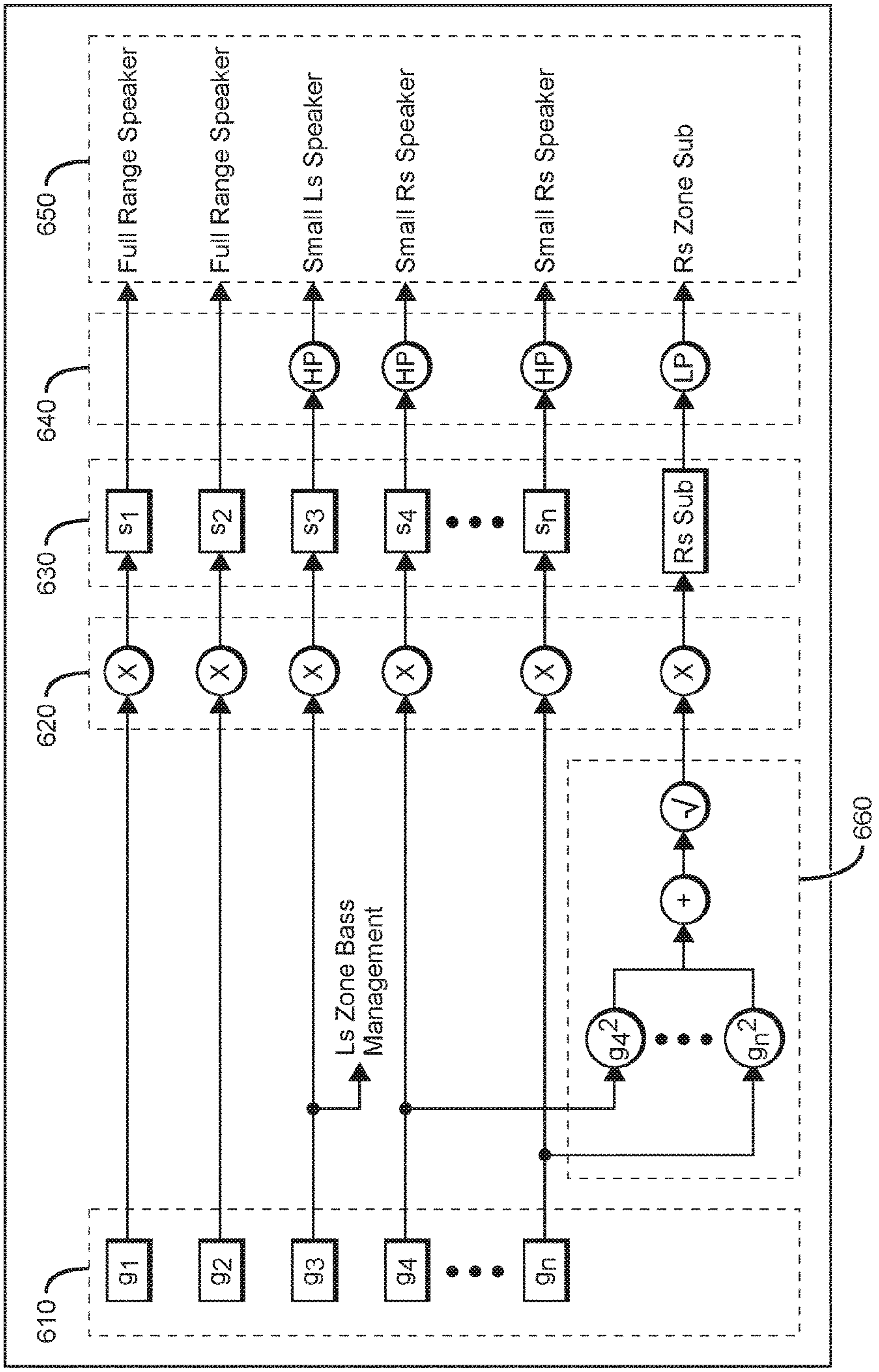
FIG. 6 is a detailed block diagram illustrating an embodiment of the bass management system and method discussed herein.

FIG. 6 is a block diagram illustrating embodiments of the bass management system 600 and method. Embodiments of the system and method shown in FIG. 6 typically will be implemented in a cinema processor and used in a cinema environment, such as the cinema environment 500 shown in FIG. 5. Other uses for embodiments of the system and method include within a consumer surround processor. The embodiments shown in FIG. 6 supports the necessary flexibility for systems using a combination of full range speakers and small, bass managed speakers, and separate bass management zones, as will be the case in typical cinemas.

For pedagogical purposes and to avoid clutter, FIG. 6 only shows the subwoofer contribution for one audio object. Embodiments of the bass management system 600 and method shown in FIG. 6 supports a mix of full range speakers and bass managed speakers, and also supports multiple bass management zones, such as the left surround zone and right surround zone, each of which drives their own subwoofers.

The system and method shown in FIG. 6 are aware of each of the speakers in the system. Moreover, the system 600 and method distribute each audio object across the speakers by using the rendering information (or metadata) contained with that audio object. For example, the rendering information dictates whether the audio object should be rendered on a single speaker or over an array of speakers. A system renderer (such as a VBAP renderer) is directly controlling how that sound is distributed to all the speakers.

The system renderer uses a mathematical process to determine exactly how much of any given sound is going to any given speaker. This information is used to determine how much bass is being duplicated into different speakers. The computation takes all the different gain coefficients, sums them together, and uses that to modulate the amount of bass that is going out from that signal to a subwoofer.

In FIG. 6 is shown the distribution model for a single audio object. Also shown are the gain coefficients for each possible speaker. The column on the left in FIG. 6 is the gain coefficient array 610, which are the outputs of the renderer for a single audio object. The input to the system 600 is gain coefficients from any renderer that generates power-normalized gains across one or more speakers. The gain coefficients array 610 contains n number of these gain coefficients ($g_1$ to $g_n$) from the renderer (not shown). These gain coefficients control how much of the waveform is going to each speaker. In some cases the gain coefficient is zero, while in other cases the gain coefficient is greater than zero.

In order to determine a subwoofer contribution coefficient for a subwoofer, the gain coefficients of the gain coefficient array 610 are processed based on the subwoofer zones of which they are a part. As explained in detail below, the processing to obtain the subwoofer contribution coefficient includes computing the power of the gain coefficients to compute the power-preserving subwoofer contribution coefficient for each subwoofer. The gain coefficients may change dynamically as the soundtrack changes. In some embodiments a smoothing function is used to mitigate audible artifacts as the computed subwoofer contribution coefficients modulate the audio feeding the subwoofer.

The gain coefficients are applied to the waveform dependent on whether the signal destination is a regular speaker or a subwoofer in the coefficient applicator section of the system 600 and method (box 620). If the destination is a regular speaker the gain coefficient is applied to the waveform and gain-modified signal is sent to the speaker output busses (box 630). Crossover filters are applied (box 640) and the processed audio signal is played back on the respective speakers (box 650).

If the destination is a subwoofer for the speaker zone then the system 600 and method computes a subwoofer contribution coefficient for the subwoofer. The derivation of the subwoofer contribution coefficient for one object feeding the Rs Sub zone subwoofer is shown box 660 of FIG. 6. Box 660 outlines the details of the computation of the subwoofer contribution coefficient for speakers sharing a common subwoofer. As shown in box 660 of FIG. 6, gain coefficients $g_4$ to $g_n$ all share the Rs Sub zone subwoofer. The system 600 and method compute the power of these gain coefficients by squaring the individual gain coefficients, summing the squares, and then taking the square root of the summed square gain coefficients. This is shown mathematically in Equation (1) below. The result is the subwoofer contribution coefficient, which is the output of box 660. The subwoofer gain coefficient is applied to the portion of the waveform destined for the subwoofer in the coefficient applicator section (box 620) and this gain-modified subwoofer audio signal is sent to the subwoofer output busses (box 630). Crossover filters are applied (box 640) and the processed subwoofer audio signal is played back in the form of audio on the correct subwoofer, in this case the Rs zone subwoofer (box 650).

The same process applies to all objects in the soundtrack, with their outputs merged in the speaker output busses, and then fed to the bass management high-pass and low-pass crossover filters. Embodiments of the system 600 and method make use of the rendering information, which includes how much of the audio object is going to each speaker (including subwoofers).

It should be noted that the manner in which the gain coefficients are determined is completely irrelevant to the renderer algorithm. The bass management system 600 and method described herein are not just for VBAP, MDA, or specific to any one type of renderer. In fact it is independent of the renderer. All the rendering is performed upstream of embodiments of the bass management system 600 and method described herein. It simply makes no difference which rendering algorithm is used.

Each of the gain coefficients represents a scale factor, in terms of amplitude of sound. So the powers of all those gain coefficients are summed together to represent a final gain coefficient. In effect it is the root mean square (RMS) of the gain coefficients. This is represented by Equation (1) set forth below.

It is desirable to use the power of the signal and not just the sum of the gain coefficients. This is because if the gain coefficients are summed only the result is the intensity of the sound, rather than the power of the sound. The acoustic representation that should be used is represented by the power of those contributions. When rendering sound across numerous speakers and it is desirable to maintain the same subjective loudness across the speakers and then maintain the same electrical power. That is why the electrical power term is the relative metric here for the bass.

Moreover, that is what is violated when all the signals together are simply added together. When adding all the signals together it no longer represents the power, but the intensity. Acoustically this is where the disparity arises.

In an object-based system, the playback system's renderer is the mechanism that controls the allocation of audio signals among the available speakers. Multiple rendering functions may operate in parallel on a given audio object, such as VBAP, Divergence, or Aperture. Each function determines the appropriate allocation of the waveform across the relevant speakers. The allocations are controlled by gain coefficients for each speaker. When multiple functions are operating in parallel on the waveform feeding a single speaker, the gain coefficients are first multiplied together to obtain a final gain coefficient before being applied to the waveform.

Each final gain coefficient represents a direct measure of the signal level of the waveform feeding each speaker. This explicit knowledge has never been available to a playback system before, and it allows the bass management system 600 to accurately calculate the acoustic power of the object's waveform across every speaker involved in bass management. That resulting power value represents the desired amount of bass signal to be fed to the subwoofer. The final gain coefficients for each speaker are shown as $g_1$ through $g_n$ in FIG. 6.

In the embodiment shown in FIG. 6, an example of a subwoofer contribution coefficient generator (box 660) computes a subwoofer contribution coefficient for the Rs subwoofer using only includes coefficients $g_4$ through $g_n$. This is because speaker 4 through n are included in the Rs speaker zone. Thus, the desired final contribution of an audio object's waveform to the subwoofer is the power sum of the $g_4$ through $g_n$ coefficients, times the waveform. Equation (1) describes the calculation of the power of the Rs subwoofer contribution as follows:

$$\text{subwoofer contribution coefficient}=\text{waveform}\sqrt{g_4^2+g_5^2\ldots+g_n^2} \quad (1).$$

Equation (1) is used to compute a subwoofer contribution coefficient for the audio object. FIG. 6 is really just a graphical way of expressing a mathematical equation. Embodiments of the system and method use power-preserving gains. The computation of the subwoofer contribution coefficients uses power-preserving gains.

The general operation of embodiments of the bass management system 600 and method shown in FIG. 6 begin by inputting an audio signal containing at least one audio object. The object-based audio supplies explicit gain information is output from an object renderer that that generates power-normalized speaker gains across one or speakers. This means that the object renderer supports multi-speaker panning, or variable extents (such as Divergence, Aperture), or channel-based array presentation.

III. Alternate Embodiments and Exemplary Operating Environment

Alternate embodiments are possible where all speakers are uniformly bass managed to a common subwoofer, as may be the case in smaller scale installations, either commercial or consumer oriented. These alternate embodiments do not require any calculation of coefficients. This is possible because the audio feeding the subwoofer is taken prior to the rendering operation, thereby avoiding the summation of multiple copies of the audio.

The embodiments shown in FIG. 6 are the most flexible embodiments in that if it is desirable to sequester bass only from a subset of the speakers (for example, have only the bass from the surround speakers going to the subwoofer), because the front speakers are covered on their own. But, if a typical home system is being used, or a smaller-scale cinema, there may not be a huge speaker behind the screen doing the bass. Thus, it may be desirable to do bass management for the entire speaker system. In this case a simplified version of the bass management system and method can be used. This is shown in the embodiments of FIG. 7.

Figure 7:
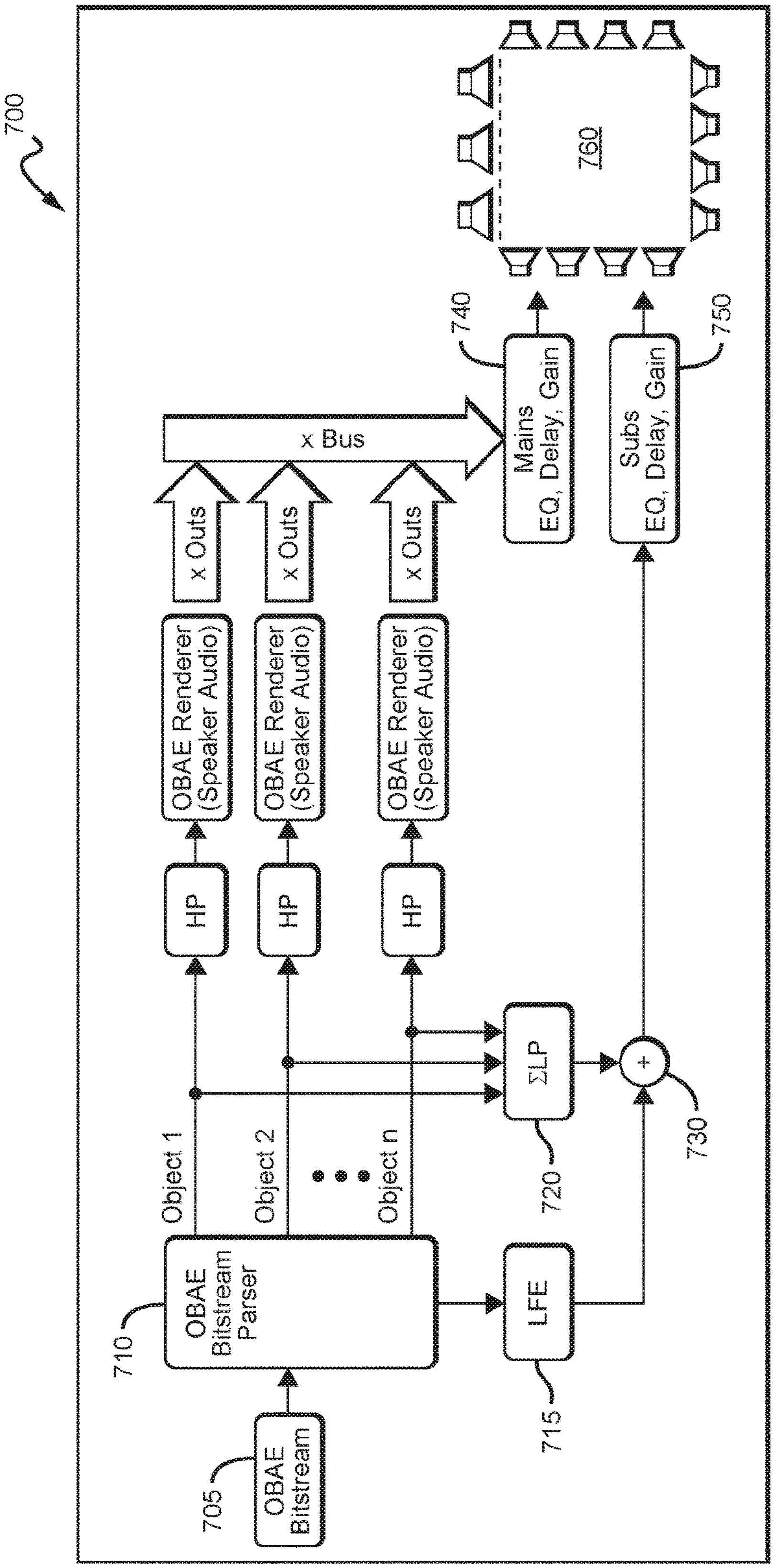
FIG. 7 is a detailed block diagram illustrating an alternate embodiment of the bass management system and method before rendering.

FIG. 7 is a detailed block diagram illustrating alternate embodiments of the bass management system and method before rendering. The embodiments shown in FIG. 7 are workable as long as the total signal energy across all the output speakers remains constant and is not altered by the various rendering operations. This is true for VBAP, Divergence, and Aperture functions.

The embodiments of FIG. 7 have a different set of requirements, including a single subwoofer. FIG. 7 illustrates the case when all of the channels are in the subwoofer. This means that all of the channels feeding all of the speakers in the system will be bass-managed in the same way. So there is no option to sub-divide which speakers are represented by the subwoofer. In addition, there is an option to change the cross-over frequencies.

As shown in FIG. 7, in general embodiments of the bass management system 700 and method strip away the bass portion of the audio signal before it even gets to the renderer. In particular, the bass is collected only from the objects directly (before the objects have been rendered). As shown in FIG. 7, the input is a two-channel signal (an OBAE bitstream 705) and an OBAE bitstream parser 710 parses out the n number of Objects (Object 1 to Object n), and the LFE 715 signal. Using a combination of high-pass filters (HP) and low-pass filters (LP) the bass is stripped off from the Objects and summed (box 720). The summed stripped bass then is mixed with the LFE signal (box 730) to obtain a low-frequency signal.

The Objects are rendered and main processing 740 is applied to the Objects and subs processing 750 is applied to the low-frequency signal. Both the processed main object signal and the processed low-frequency signal are played back in an audio environment 760. In some embodiments the processed main object signal is run through a surround processor (not shown) that spreads it between surround sound speaker (typically 5, 7, or 11 speakers. The surround processor performs spatial rendering of the multiple audio objects in the audio environment over the surround sound speakers such that they form a surround sound configuration in the audio environment. The processed low-frequency bass can either be put back in or sent through a subwoofer.

Some embodiments of the bass management system and method include a metadata parameter called a Rendering Exception parameter. The Rendering Exception parameter allows any gain changes to be made in the renderer an when there is a renderer exception. This occurs after the bass from all the objects has been corrected and it is desirable to change how much of that object is represented in a speaker further downstream. If the level of the object is changing then it is also prudent to change how much of its bass is represented.

Figure 8:
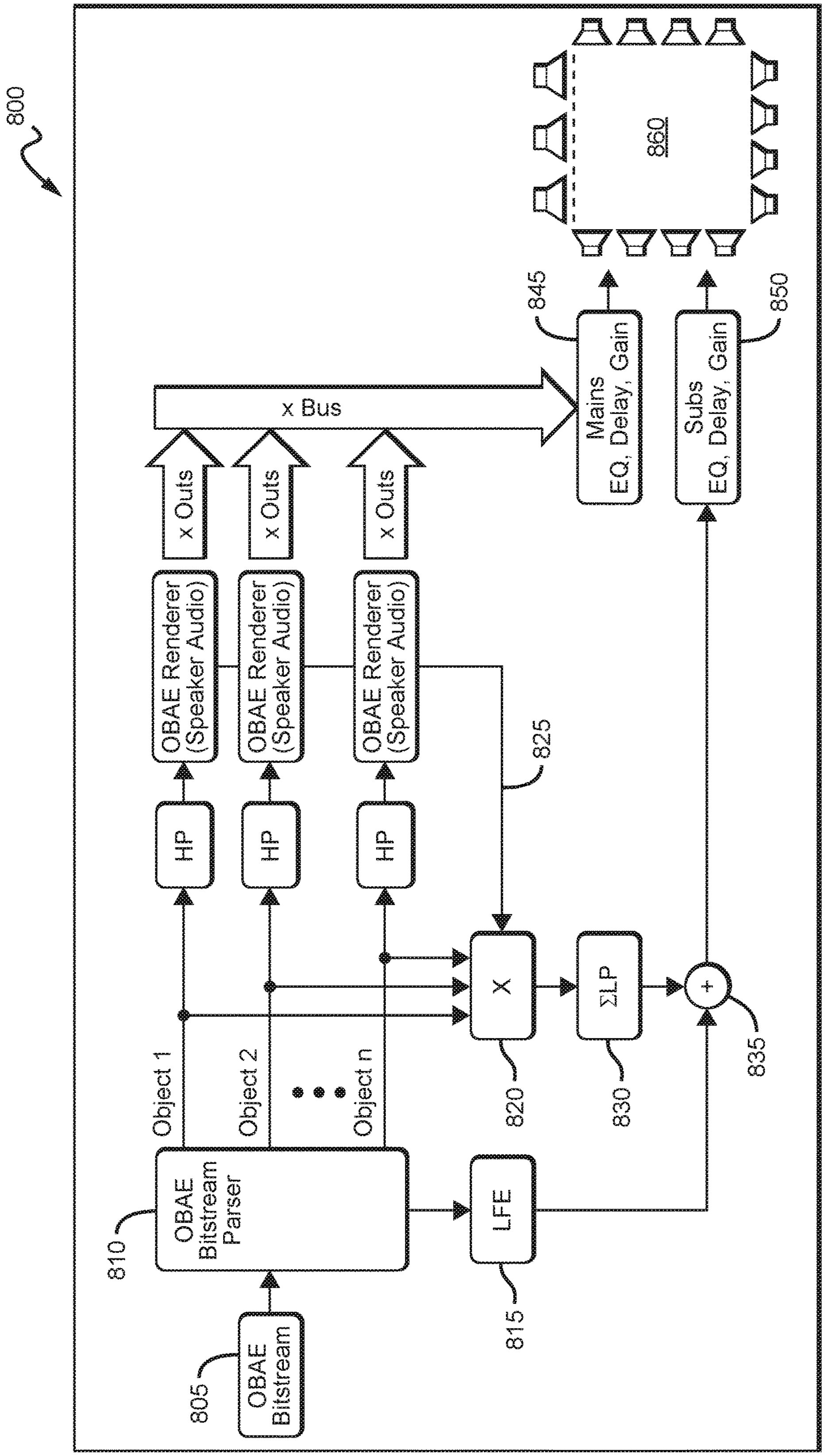
FIG. 8 is a detailed block diagram illustrating embodiments of the bass management system and method that use a Rendering Exception parameter with the renderer gains applied to bass management feeds.

FIG. 8 is a detailed block diagram illustrating embodiments of the bass management system 800 and method that use a Rendering Exception parameter with the renderer gains applied to bass management feeds. As shown in FIG. 8, in order for the collected bass signals to track these gain changes the rendering gain parameter must also be applied to the signals feeding a bass summer.

Specifically, in FIG. 8 the input is an OBAE bitstream 805. An OBAE bitstream parser 810 parses out the n number of Objects (Object 1 to Object n) as well as the LFE 815 signal. Using a combination of high-pass filters (HP) and low-pass filters (LP) the bass frequencies are stripped off from the Objects and input to a processor (box 820). Also input to the processor is the Rendering Exception parameter 825 that reflects changes in the gain of the rendered Objects. The stripped bass frequencies are summed (box 830) and the summed stripped bass then is mixed with the LFE signal (box 835) to obtain a low-frequency signal.

The Objects are rendered in accordance with any gain changes made in the OBAE renderers. Main processing 845 is applied to the Objects and subs processing 850 is applied to the low-frequency signal. Both the processed main object signal and the processed low-frequency signal are played back in an audio environment 860. Similar to the embodiments shown in FIG. 7, in some embodiments the processed main object signal is run through a surround processor (not shown) that spreads it between surround sound speaker (typically 5, 7, or 11 speakers. The processed low-frequency bass can either be put back in or sent through a subwoofer.

Embodiments of the bass management system and method shown in FIGS. 6-8 supports mixed speaker types or mixed zones. The power of renderer function coefficients then are computed in order to derive a subwoofer contribution coefficient for an audio object. These are the "g" terms in FIG. 6.

Many other variations than those described herein will be apparent from this document. For example, depending on the embodiment, certain acts, events, or functions of any of the methods and algorithms described herein can be performed in a different sequence, can be added, merged, or left out altogether (such that not all described acts or events are necessary for the practice of the methods and algorithms). Moreover, in certain embodiments, acts or events can be performed concurrently, such as through multi-threaded processing, interrupt processing, or multiple processors or processor cores or on other parallel architectures, rather than sequentially. In addition, different tasks or processes can be performed by different machines and computing systems that can function together.

The various illustrative logical blocks, modules, methods, and algorithm processes and sequences described in connection with the embodiments disclosed herein can be implemented as electronic hardware, computer software, or combinations of both. To clearly illustrate this interchangeability of hardware and software, various illustrative components, blocks, modules, and process actions have been described above generally in terms of their functionality. Whether such functionality is implemented as hardware or software depends upon the particular application and design constraints imposed on the overall system. The described functionality can be implemented in varying ways for each particular application, but such implementation decisions should not be interpreted as causing a departure from the scope of this document.

The various illustrative logical blocks and modules described in connection with the embodiments disclosed herein can be implemented or performed by a machine, such as a general purpose processor, a processing device, a computing device having one or more processing devices, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor and processing device can be a microprocessor, but in the alternative, the processor can be a controller, microcontroller, or state machine, combinations of the same, or the like. A processor can also be implemented as a combination of computing devices, such as a combination of a DSP and a microprocessor, a plurality of microprocessors, one or more microprocessors in conjunction with a DSP core, or any other such configuration.

Embodiments of the bass management system and method described herein are operational within numerous types of general purpose or special purpose computing system environments or configurations. In general, a computing environment can include any type of computer system, including, but not limited to, a computer system based on one or more microprocessors, a mainframe computer, a digital signal processor, a portable computing device, a personal organizer, a device controller, a computational engine within an appliance, a mobile phone, a desktop computer, a mobile computer, a tablet computer, a smartphone, and appliances with an embedded computer, to name a few.

Such computing devices can be typically be found in devices having at least some minimum computational capability, including, but not limited to, personal computers, server computers, hand-held computing devices, laptop or mobile computers, communications devices such as cell phones and PDA's, multiprocessor systems, microprocessor-based systems, set top boxes, programmable consumer electronics, network PCs, minicomputers, mainframe computers, audio or video media players, and so forth. In some embodiments the computing devices will include one or more processors. Each processor may be a specialized microprocessor, such as a digital signal processor (DSP), a very long instruction word (VLIW), or other microcontroller, or can be conventional central processing units (CPUs) having one or more processing cores, including specialized graphics processing unit (GPU)-based cores in a multi-core CPU.

The process actions of a method, process, or algorithm described in connection with the embodiments disclosed herein can be embodied directly in hardware, in a software module executed by a processor, or in any combination of the two. The software module can be contained in computer-readable media that can be accessed by a computing device. The computer-readable media includes both volatile and nonvolatile media that is either removable, non-removable, or some combination thereof. The computer-readable media is used to store information such as computer-readable or computer-executable instructions, data structures, program modules, or other data. By way of example, and not limitation, computer readable media may comprise computer storage media and communication media.

Computer storage media includes, but is not limited to, computer or machine readable media or storage devices such as Bluray discs (BD), digital versatile discs (DVDs), compact discs (CDs), floppy disks, tape drives, hard drives, optical drives, solid state memory devices, RAM memory, ROM memory, EPROM memory, EEPROM memory, flash memory or other memory technology, magnetic cassettes, magnetic tapes, magnetic disk storage, or other magnetic storage devices, or any other device which can be used to store the desired information and which can be accessed by one or more computing devices.

A software module can reside in the RAM memory, flash memory, ROM memory, EPROM memory, EEPROM memory, registers, hard disk, a removable disk, a CD-ROM, or any other form of non-transitory computer-readable storage medium, media, or physical computer storage known in the art. An exemplary storage medium can be coupled to the processor such that the processor can read information from, and write information to, the storage medium. In the alternative, the storage medium can be integral to the processor. The processor and the storage medium can reside in an application specific integrated circuit (ASIC). The ASIC can reside in a user terminal. Alternatively, the processor and the storage medium can reside as discrete components in a user terminal.

The phrase "non-transitory" as used in this document means "enduring or long-lived". The phrase "non-transitory computer-readable media" includes any and all computer-readable media, with the sole exception of a transitory, propagating signal. This includes, by way of example and not limitation, non-transitory computer-readable media such as register memory, processor cache and random-access memory (RAM).

The phrase "audio signal" is a signal that is representative of a physical sound.

Retention of information such as computer-readable or computer-executable instructions, data structures, program modules, and so forth, can also be accomplished by using a variety of the communication media to encode one or more modulated data signals, electromagnetic waves (such as carrier waves), or other transport mechanisms or communications protocols, and includes any wired or wireless information delivery mechanism. In general, these communication media refer to a signal that has one or more of its characteristics set or changed in such a manner as to encode information or instructions in the signal. For example, communication media includes wired media such as a wired network or direct-wired connection carrying one or more modulated data signals, and wireless media such as acoustic, radio frequency (RF), infrared, laser, and other wireless media for transmitting, receiving, or both, one or more modulated data signals or electromagnetic waves. Combinations of the any of the above should also be included within the scope of communication media.

Further, one or any combination of software, programs, computer program products that embody some or all of the various embodiments of the bass management system and method described herein, or portions thereof, may be stored, received, transmitted, or read from any desired combination of computer or machine readable media or storage devices and communication media in the form of computer executable instructions or other data structures.

Embodiments of the bass management system and method described herein may be further described in the general context of computer-executable instructions, such as program modules, being executed by a computing device. Generally, program modules include routines, programs, objects, components, data structures, and so forth, which perform particular tasks or implement particular abstract data types. The embodiments described herein may also be practiced in distributed computing environments where tasks are performed by one or more remote processing devices, or within a cloud of one or more devices, that are linked through one or more communications networks. In a distributed computing environment, program modules may be located in both local and remote computer storage media including media storage devices. Still further, the aforementioned instructions may be implemented, in part or in whole, as hardware logic circuits, which may or may not include a processor.

Conditional language used herein, such as, among others, "can," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list.

While the above detailed description has shown, described, and pointed out novel features as applied to various embodiments, it will be understood that various omissions, substitutions, and changes in the form and details of the devices or algorithms illustrated can be made without departing from the spirit of the disclosure. As will be recognized, certain embodiments of the inventions described herein can be embodied within a form that does not provide all of the features and benefits set forth herein, as some features can be used or practiced separately from others.

Moreover, although the subject matter has been described in language specific to structural features and methodological acts, it is to be understood that the subject matter defined in the appended claims is not necessarily limited to the specific features or acts described above. Rather, the specific features and acts described above are disclosed as example forms of implementing the claims.

What is claimed is:

1. A method for processing an audio signal, comprising:
- defining a speaker zone within an audio environment that contains a plurality of speakers and a subwoofer;
- inputting from a renderer speaker gain coefficients from each of the plurality of speakers in the speaker zone;
- combining the speaker gain coefficients from each of the plurality of speakers in the speaker zone to obtain combined speaker gain coefficients;
- computing a power of the combined speaker gain coefficients to obtain a power-preserving subwoofer contribution coefficient that preserves the power of the combined gain coefficients;
- applying the subwoofer contribution coefficient to a subwoofer audio signal to obtain a gain-modified subwoofer audio signal that feeds the subwoofer;
- playing back in the audio environment the gain-modified subwoofer audio signal through the subwoofer to ensure that an amount of bass signal is applied to the subwoofer avoids bass management error;
- wherein the audio signal contains an audio object and associated rendering information.

2. The method of claim 1, further comprising defining multiple speaker zones, each of the speaker zones containing a plurality of different speakers and subwoofers and each of the speaker zones containing a different number of speakers and subwoofers as compared to other speaker zones.

3. The method of claim 2, further comprising computing a subwoofer contribution coefficient for each subwoofer in each of the multiple speaker zones.

4. A method for processing an audio signal containing an audio object and associated rendering information, comprising:
- defining, in an audio environment, a speaker zone containing a plurality of speakers and a subwoofer;
- inputting from a renderer speaker gain coefficients from each of the plurality of speakers in the speaker zone;
- combining the speaker gain coefficients from each of the plurality of speakers in the speaker zone to obtain combined speaker gain coefficients;
- computing a power of the combined speaker gain coefficients to obtain a power-preserving subwoofer contribution coefficient that preserves the power of the combined gain coefficients, wherein computing the power of the combined speaker gain coefficients further comprises:
  - squaring each of the individual speaker gain coefficients to obtain squared gain coefficients;
  - summing the squared gain coefficients to obtain a sum of squares; and
  - obtaining the subwoofer contribution coefficient for the subwoofer by taking the square root of the sum of squares;
- applying the subwoofer contribution coefficient to a subwoofer audio signal to obtain a gain-modified subwoofer audio signal that feeds the subwoofer; and
- playing back in the audio environment the gain-modified subwoofer audio signal through the subwoofer to ensure that an amount of bass signal is applied to the subwoofer avoids bass management error.

5. The method of claim 4, wherein computing the power of the combined speaker gain coefficients to obtain the subwoofer contribution coefficient further comprises using the equation:

$$\text{subwoofer contribution coefficient} = \text{waveform}\sqrt{g_4^2 + g_5^2 \ldots + g_n^2}$$

wherein n is a number of speakers in the audio environment, g is the speaker gain coefficient for a respective speaker in the audio environment, and waveform is the subwoofer audio signal.

6. A method for processing an audio signal containing a multiple audio objects, comprising:
- using a low-pass filter to strip away a bass frequency portion from each of the multiple audio objects before the multiple audio objects are rendered by a renderer to obtain stripped bass portions;
- summing the stripped bass portions and mixing with a Low-Frequency Effects (LFE) signal to obtain a low-frequency signal; and
- rendering the low-frequency signal and then playing back the low-frequency signal in an audio environment.

7. The method of claim 6, wherein the audio environment contains multiple speakers and single subwoofer.

8. The method of claim 7, further comprising processing the audio signal using a surround processor to perform spatial rendering of the multiple audio objects in the audio environment, and wherein a number of the multiple speakers is such that they form a surround sound configuration in the audio environment.

9. The method of claim 6, further comprising applying a rendering exception parameter to the low-frequency signal to reflect changes in a gain of rendered multiple audio objects.

10. A bass management system for determining an amount of subwoofer audio signal to play through a subwoofer for an audio object in an audio signal, the system comprising:
- a speaker zone within an audio environment containing a plurality of speakers and a subwoofer;
- a renderer that generates speaker gain coefficients for each of the plurality of speakers in the speaker zone;
- a subwoofer contribution coefficient generator that computes a power of each of the speaker gain coefficients by squaring each of the speaker gain coefficients, summing the squares, and then taking the square root of the sum to generate a power-preserving subwoofer contribution coefficient for the subwoofer that preserves the power of the speaker gain coefficients; and a coefficient applicator that applies the subwoofer contribution coefficient to a portion of the audio signal being sent to the subwoofer to obtain a gain-modified subwoofer audio signal.

11. The bass management system of claim 10, further comprising multiple speaker zones each containing a variety of different types and number of speakers and subwoofers and wherein a unique subwoofer contribution coefficient is computed for each of the multiple speaker zones.

12. The bass management system of claim 10, further comprising a smoothing function applied to the subwoofer contribution coefficient to prevent audible artifacts as the gain coefficients change over time.

13. A method for processing an object-based audio signal containing multiple audio objects along with associated rendering information and a plurality of audio signals for each of the multiple audio objects, comprising:

determining a number of speakers in a speaker zone within an audio environment over which the object-based audio signal will be played back;

using a renderer to generate speaker gain coefficients for the speakers for each of the plurality of audio signals;

squaring each of the speaker gain coefficients for each of the plurality of audio signal to obtain squared speaker gain coefficients;

summing the squared speaker gain coefficients to obtain a sum of squares;

taking the square root of the sum of squares to obtain a power-preserving subwoofer contribution coefficient that preserves a power of a combination of the speaker gain coefficients;

applying the subwoofer contribution coefficient to each of the plurality of audio signals to obtain gain-modified audio signals;

summing together each of the gain-modified audio signals corresponding to each of the plurality of audio signals within the speaker zone to obtain a summed audio signal;

stripping a bass frequency portion of the summed audio signal to obtain a gain-modified subwoofer audio signal that feeds a subwoofer; and spatially rendering the plurality of audio signals in the audio environment based on the rendering information and the gain-modified subwoofer audio signal such that a subwoofer contribution is correct for each of the multiple audio objects and avoids or mitigates any bass management errors.

14. The method of claim 13, further comprising:

defining multiple speaker zones for the speakers in the audio environment such that each speaker is a part of only one of the multiple speaker zones and each of the multiple speaker zones has a subwoofer; and determining a subwoofer contribution coefficient for each subwoofer in each of the multiple speaker zones.

15. The method of claim 14, wherein each of the multiple speaker zones contains a different number of speakers as compared to other speaker zones.

* * * * *